United States Patent
Ootsuka et al.

(10) Patent No.: US 6,924,237 B2
(45) Date of Patent: Aug. 2, 2005

(54) METHOD FOR MANUFACTURING SEMICONDUCTOR INTEGRATED CIRCUIT DEVICE

(75) Inventors: Fumio Ootsuka, Tokorozawa (JP); Satoshi Yamamoto, Ome (JP); Satoshi Sakai, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 281 days.

(21) Appl. No.: 10/281,189

(22) Filed: Oct. 28, 2002

(65) Prior Publication Data

US 2003/0096501 A1 May 22, 2003

(30) Foreign Application Priority Data

Nov. 20, 2001 (JP) ........................................ 2001-355053

(51) Int. Cl.[7] ............................................. H01L 21/302
(52) U.S. Cl. ........................ 438/696; 438/303; 438/305; 438/585; 438/591; 438/589; 438/595
(58) Field of Search ................................. 438/303, 305, 438/585, 591, 589, 595, 696

(56) References Cited

U.S. PATENT DOCUMENTS 6,159,782 A * 12/2000 Xiang et al. ................ 438/197
6,210,999 B1 * 4/2001 Gardner et al. ............. 438/183
6,380,589 B1 * 4/2002 Krivokapic ................. 257/347

OTHER PUBLICATIONS

D.A. Buchanan, et al., "80 nm poly–silicon gated n–FETs with ultra–thin $Al_2O_3$ gate dielectric for ULSI applications".

* cited by examiner

Primary Examiner—George A. Goudreau
(74) Attorney, Agent, or Firm—Antonelli, Terry, Stout & Kraus, LLP

(57) ABSTRACT

A method is used to form a circuit to achieve a high-speed performance and a circuit to attain a high reliability on one and the same substrate, in a semiconductor integrated circuit device containing MIS transistors, in which the gate insulating film is made of a high dielectric constant insulating film. In the method, the high dielectric constant insulating film is removed on the diffusion regions of the MIS transistors in the logic region and I/O region, and silicide layers of a low resistance are formed on the surfaces of the diffusion regions. In the memory region, on the other hand, the silicide layers are not formed on the diffusion regions of the MIS transistors, and the diffusion regions are covered with the high dielectric constant insulating film, thereby preventing damage to the semiconductor substrate during forming of the spacers, silicide layers, and contact holes.

20 Claims, 11 Drawing Sheets

METHOD FOR MANUFACTURING SEMICONDUCTOR INTEGRATED CIRCUIT DEVICE

BACKGROUND OF THE INVENTION

The present invention relates to a technique for use in the manufacture of a semiconductor integrated circuit device; and more specifically, the invention relates to a technique that is effective for application to a semiconductor integrated circuit device including a short channel MIS (metal insulator semiconductor) having a gate length, i.e. the width of the gate electrode, which is less than 0.1 μm.

The film thickness of the gate insulating film in a MIS transistor having a gate length which is less than 0.07 μm is presumed to be less than 1.2 nm. However, thinning a conventionally used silicon oxide film for use in the gate insulating film will cause the leakage current to exceed 10 A/cm$^2$, which involves an increase in the standby current, thereby creating a problem.

Accordingly, a trial has been conducted using an insulating film having a comparably high relative dielectric constant (hereunder referred to as a high dielectric constant insulating film), for example, an alumina film having a relative dielectric constant which is about 7 to 11 for the gate insulating film, and in which the effective film thickness is reduced while maintaining the physical film thickness at 1.5 nm or more. Here, the effective film thickness signifies an equivalent silicon oxide film thickness in consideration of the relative dielectric constant.

As an example, the publication IEDM (International Electron Device Meetings in an article entitled "80 nm polysilicon gated n-FETs with ultra-thin Al2O3 gate dielectric for ULSI applications" at pp. 223–226, 2000) discloses the performance characteristic of a MIS transistor having a gate insulating film made of an alumina film, with a gate length of less than 0.1 μm.

SUMMARY OF THE INVENTION

As the integration of semiconductor devices increases, the MIS transistor is being made still finer according to the scaling law; and, accompanied with this, the resistances of the gate, source, and drain regions increase, thus leading to a problem in that the micro-structuring of the MIS transistor does not provide a high-speed performance. And, in the MIS transistor having a gate length of less than 0.2 μm, for example, a high-speed performance has been pursued by silicifying the conductive film forming the gate, as well as the semiconductor regions forming the sources and drains.

For example, in order to form silicide layers on the surfaces of the semiconductor regions forming sources and drains, a method is employed which removes an insulating film on the same layer as a gate insulating film on the substrate, for example, by reactive etching, and, thereafter, forms silicide layers of a low resistance on the surfaces of the semiconductor regions forming sources and drains by use of a self-aligning method. The above-mentioned reactive etching is one example of dry etching techniques typically used in a semiconductor manufacturing process, in which etching through a chemical reaction is performed by utilizing a chemically active excited activator. This technique will restrain etching damage so as to achieve a comparably high etching selection ratio.

However, the inventor of this invention has examined the technique used in the manufacture of a MIS device using a high dielectric constant insulating film for the gate insulating film, and it was confirmed clearly that with the reactive etching, it is difficult to remove the high dielectric constant insulating film, and this leads to an impossibility of silicifying the semiconductor regions forming sources and drains.

As a means to solve the above problem that hinders manufacturing a high-speed MIS device, the technique of sputter etching has been examined for use in physically removing a high dielectric constant insulating film on the semiconductor regions forming sources and drains. The result shows that sputter etching is likely to damage the substrate, and, thereby, this invites the lowering of the reliability of the MIS transistor. As an example, applying sputter etching to memory cells tends to create a problem that increased junction leakage currents and retention data errors, and so forth, are caused.

An object of the present invention is to provide a technique that makes it possible to form a circuit to accomplish a high-speed performance and a circuit to attain a high reliability on one and the same substrate, in a semiconductor integrated circuit device having plural types of MIS transistors, in which the gate insulating film is made of a high dielectric constant insulating film.

The above and other objects and novel features of the invention will become apparent from the following descriptions and the accompanying drawings.

The typical aspects of the invention disclosed in this application will be summarized as follows.

(1) The method of manufacture of a semiconductor integrated circuit device includes the steps of: preparing a semiconductor substrate of a first conductive type, having a first region and a second region on a surface thereof; forming plural trenches on the surface of the semiconductor substrate in the first region and the second region, and forming a first insulating film inside the plural trenches; forming a second insulating film having a relative dielectric constant that is higher than that of the first insulating film on the surface of the semiconductor substrate in the first region and the second region; forming a first conductive piece on the second insulating film in the first region, and forming a second conductive piece on the second insulating film in the second region; introducing first impurities of a second conductive type opposite to the first conductive type into the surface of the semiconductor substrate, in a region of both ends of the first conductive piece and a region of both ends of the second conductive piece; removing the second insulating film, except at least a lower layer of the first conductive piece and the second region; depositing a high melting point metal film to overlie the semiconductor substrate; and selectively forming a silicide layer in a region between the first conductive piece on the surface of the semiconductor substrate and the first insulating film, in the first region.

(2) The method of manufacture of a semiconductor integrated circuit device further includes, in addition to the steps included in the above-described manufacturing method (1), the steps of: depositing a third insulating film in the first and second regions; applying etching to the third insulating film to form a first contact hole in a region between the first conductive piece and the first insulating film, in the first region; applying etching to the third insulating film to form a second contact hole in a region between the second conductive piece and the first insulating film, in the second region; and forming a third conductive piece in the first contact hole, and a fourth conductive piece in the second contact hole, in which the distance between the first conductive piece and the first insulating film in the first region is larger than the distance between the second conductive piece and the first insulating film in the second region.

DETAILED DESCRIPTION OF THE PREFERRED EMBODIMENTS

The embodiments of the invention will be described in detail with reference to the accompanying drawings. In all the drawings, those members having the same functions are identified by the same symbols, and repetitive descriptions thereof will be omitted.

Embodiment 1

Figure 1:
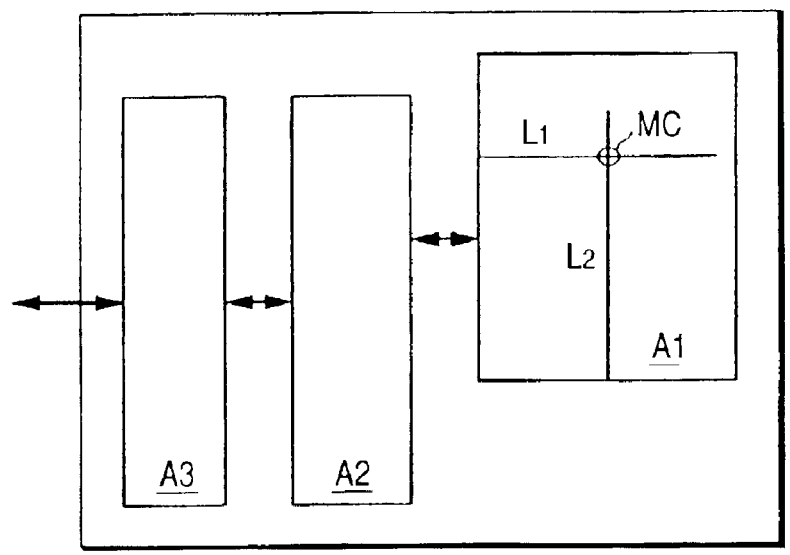
FIG. 1 is a block diagram of a semiconductor integrated circuit device representing one embodiment of the invention.

FIG. 1 is a block diagram showing one example of the semiconductor integrated circuit device according to one embodiment of the invention. First, a general outline of the construction of the semiconductor integrated circuit device of the embodiment 1 will be described with reference to the drawing.

The semiconductor integrated circuit device is roughly divided into a memory region, logic region, and I/O (Input/Output interface) region.

The memory region A1 has $2^{N+M}$ memory cells MC (or, simply cells) arrayed, each of which memorizes, for example, one bit of binary information, so that the memory region A1 is capable of memorizing $2^{N+M}$ bits of information. The memory cells MC are arrayed two-dimensionally in a matrix structure, among which a memory cell MC is accessed by enabling each one of the selection lines $L_1$, $L_2$ in the row and column directions to select the memory cell MC lying at the intersection thereof. Assuming that the number of selection lines $L_1$ in the row direction is $2^N$ and the number of the selection lines $L_2$ in the column direction is $2^M$, the number of the circuits to drive the memory cells is $2^N+2^M$. The memory region A1 is called a memory cell array, a memory matrix, a memory array, or simply an array. And, the selection line $L_1$ in the row direction is called a row line, X line, or word line; while, the selection line $L_2$ in the column direction is called a column line, Y line, or data line.

The logic region A2 is an associated circuit block that controls the memory region A1 on the basis of the control signals or data supplied to the I/O region A3, and it exchanges data with the memory region A1. One of the typical circuit blocks is a decoder, for example. The decoders constitute a logic circuit group that receives N pairs and M pairs of address signals from the address buffers inside the I/O region A3, and selects one row line among the $2^N$ row lines and one column line among $2^M$ column lines. The drivers connected to the outputs of individual decoders drive the row lines and the column lines. It also includes an I/O control circuit that controls the exchange of data, and so forth.

The I/O region A3 is a circuit block that converts the control signals and the write data inputted from the outside into internal signals and operates to transfer the results to the logic region A2, and it outputs to the outside the read data that is taken out to the logic region A2 from the memory region A1. One of the typical circuit blocks is an address buffer, for example. The address buffers are circuits that receive (N+M) address input signals for appointing cell selection addresses inside the memory region A1, and they generate N pairs and M pairs of internal address signals. It also includes a data I/O circuit, write control circuit or control block circuit, and so forth.

Figure 2:
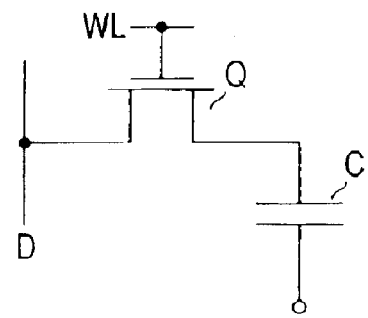
FIG. 2 is an equivalent circuit diagram of a DRAM cell formed in a memory region.
Figure 3:
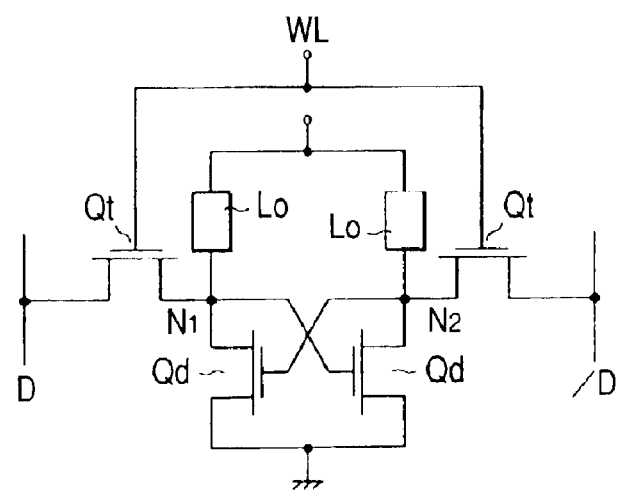
FIG. 3 is an equivalent circuit diagram of a SRAM cell formed in a memory region.

Next, a memory cell arranged in the memory region A1 will be described as an example. FIG. 2 illustrates an equivalent circuit of a memory cell of a DRAM (Dynamic Random Access Memory); while, FIG. 3 illustrates an equivalent circuit of a memory cell of a SRAM (Static Random Access Memory). In addition to these, memory cells can be cited which constitute a logic consolidated memory having memory circuits and logic circuits formed on one substrate, and a nonvolatile memory, etc., however, the explanations of these will be omitted.

As shown in FIG. 2, a DRAM cell is composed of a MIS transistor Q that performs as a switch, and a capacitor C that stores information in the form of a charge. The DRAM cell stores information on the basis of whether the capacitor C holds a charge or not, that is, whether the terminal voltage across the capacitor C is high or low, in correspondence with the binary information "1", "0". A data write operation involves the applying of a voltage corresponding to the data from the outside to the cell. A data read operation involves taking out information indicating whether the capacitor C holds a charge or not to the outside of the cell, in correspondence with the high or low level of the voltage, and checking the information.

As shown in FIG. 3, a SRAM cell is composed of a flip-flop circuit that operates to store data and two transfer MIS transistors Qt. By applying a voltage to the word line WL to turn on the transfer MIS transistors Qt, data is exchanged between the data line pair D, /D and the flip-flop circuit. The flip-flop circuit is configured with two inverters, such that the input of one inverter is connected to the output of the other inverter, and the output of the one is connected to the input of the other. The inverters are made up of load elements Lo and drive MIS transistors Qd. The load element Lo can be a MIS transistor or a resistance element, for example, a polycrystalline silicon film.

During data writing, the high voltage (H) is applied to one of the data line pair D, /D, and the low voltage (L) is applied to the other to supply these voltages to a pair of nodes $N_1$, $N_2$. The two combinations of these voltages to be given (D, /D are given H, L or L, H, respectively) are associated with the binary write data. The data reading is performed by detecting the voltages appearing on the data line pair D, /D in correspondence with the combinations of the high and low levels of the voltages at the nodes $N_1$, $N_2$.

Figure 4:
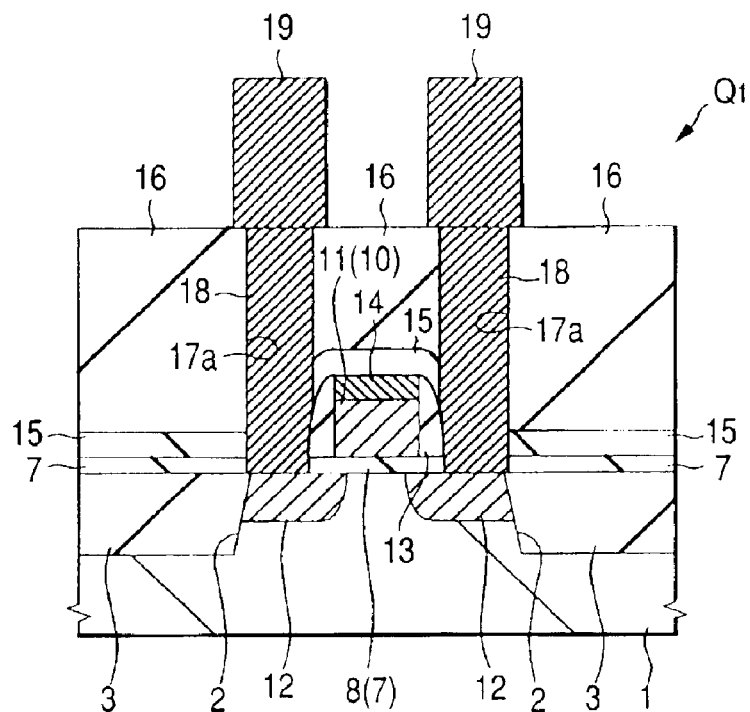
FIG. 4 is a sectional view of a major part of the semiconductor substrate, which illustrates an n-channel MIS transistor formed in a memory region.
Figure 5:
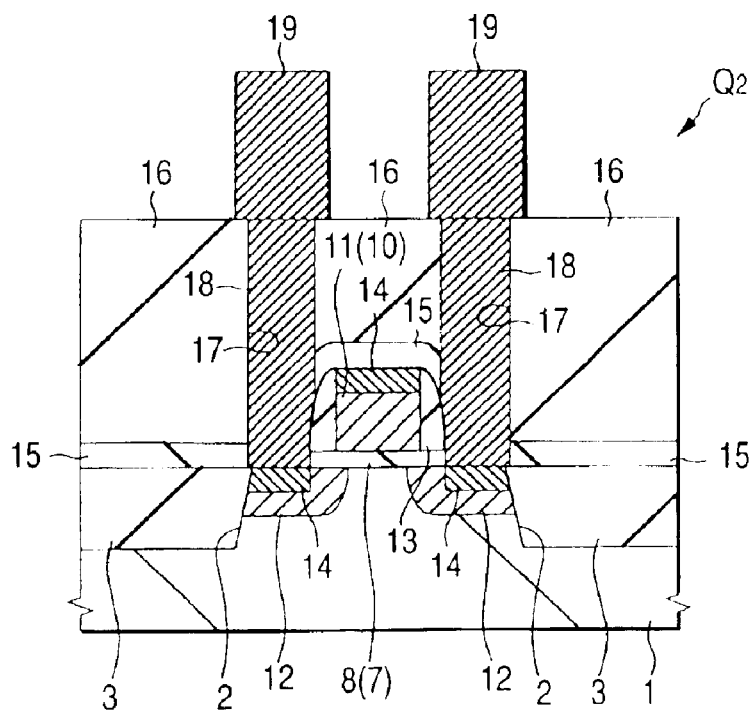
FIG. 5 is a sectional view of a major part of the semiconductor substrate, which illustrates the n-channel MIS transistor formed in a logic region.
Figure 6:
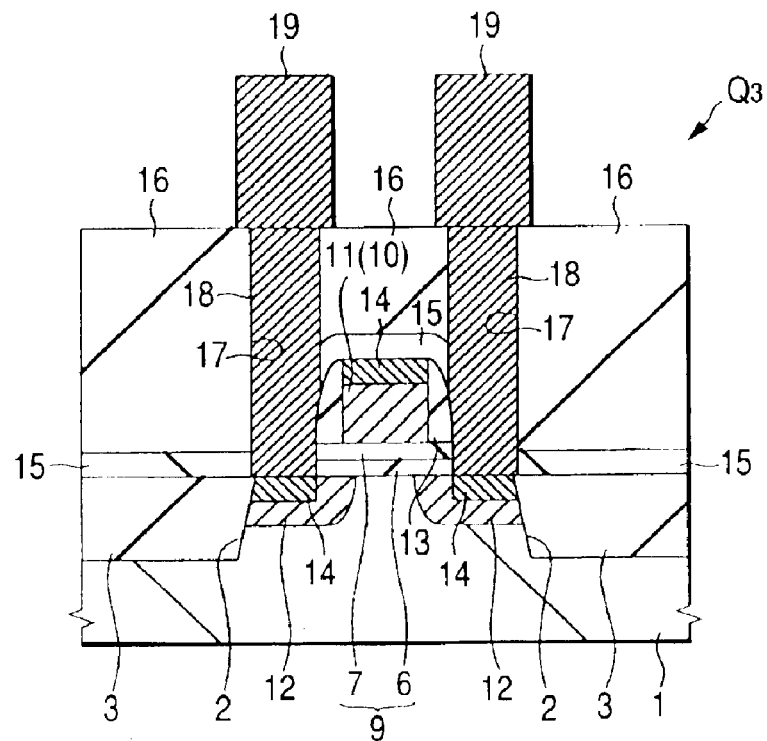
FIG. 6 is a sectional view of a major part of the semiconductor substrate, which illustrates the n-channel MIS transistor formed in an I/O region.
Figure 7:
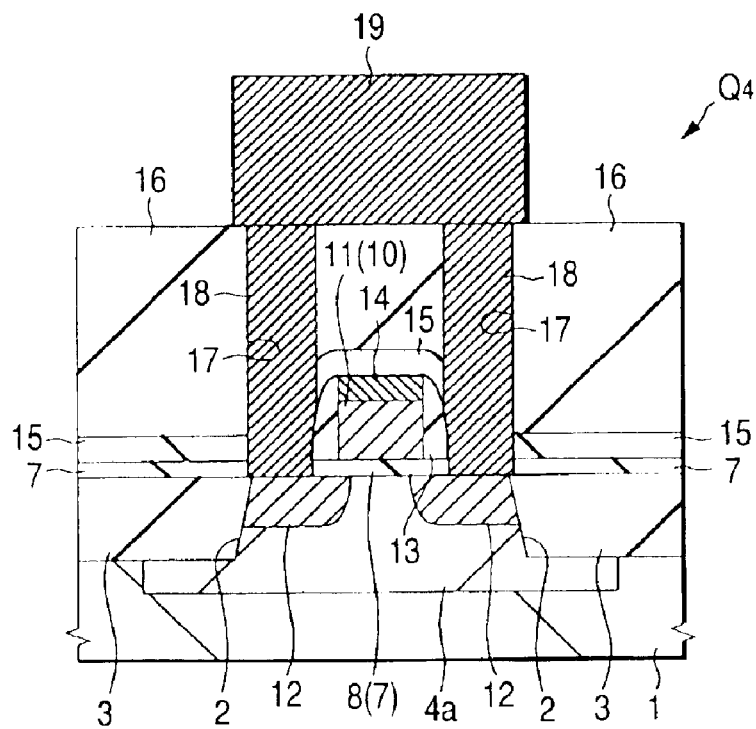
FIG. 7 is a sectional view of a major part of the semiconductor substrate, which illustrates the n-channel MIS transistor forming a capacitance element.

Next, an example of the semiconductor integrated circuit device representing the embodiment 1 will be described with reference to sectional views of a major part of the semiconductor substrate, as illustrated in FIG. 4 through FIG. 7. FIG. 4 illustrates an n-channel MIS transistor formed in the memory region; FIG. 5 illustrates the n-channel MIS transistor formed in the logic region; FIG. 6 illustrates the n-channel MIS transistor formed in the I/O region; and FIG. 7 illustrates the n-channel MIS transistor forming a capacitance element.

First, an n-channel MIS transistor $Q_1$ formed in the memory region will be described with reference to FIG. 4. As an example, the n-channel MIS transistor $Q_1$ can be identified as the selection MIS transistor Q which forms a constituent element of the DRAM cell mentioned with reference to FIG. 2, and the transfer MIS transistor Qt and the drive MIS transistor Qd which form constituents of the SRAM cell mentioned with reference to FIG. 3. The threshold voltage (Vth) of the n-channel MIS transistor Q, is comparably high, which can be regarded as, for example, about 0.4 Volt. In case of using two kinds of supply voltages, for example, the operation voltage (Vcc) applied to the n-channel MIS transistor $Q_1$ is a low voltage, which can be set to, for example, about 0.85 Volt.

The n-channel MIS transistor Q, is formed in an active region that is surrounded by device isolation sections formed on a p-type semiconductor substrate 1. The device isolation sections are made up of shallow trenches 2 formed on the semiconductor substrate 1, and a silicon oxide film 3 embedded therein. On the surface of the semiconductor substrate 1, a pair of n-type semiconductor regions 12 forms the source and the drain.

A gate insulating film 8, that is formed of a high dielectric constant insulating film 7, is formed on the semiconductor substrate 1, on which there is a gate electrode (conductive piece) 11 formed of a polycrystalline silicon film 10. The high dielectric constant insulating film 7 is formed on substantially the whole surface of the active regions and the device isolation sections overlying the semiconductor substrate 1. A spacer (sidewall insulating film) 13, that is made of, for example, a silicon oxide film, is formed on the sidewall of the gate electrode 11, and a silicide layer 14 is formed on the gate electrode 11.

To cover substantially the whole surface of the semiconductor substrate 1, a SAC (self-aligned contact) insulating film 15 and an interlayer insulating film 16 are formed in order from the lower layer. The SAC insulating film 15 can be made of, for example, a silicon nitride film; and, the interlayer insulating film 16 can be made of, for example, a silicon oxide film. The SAC insulating film 15 functions as an etching stopper layer for the interlayer insulating film 16.

However, in case the high dielectric constant insulating film 7 can be used as an etching stopper layer for the interlayer insulating film 16, it is not necessary to form the SAC insulating film 15.

Contact holes 17a are formed through the interlayer insulating film 16, the insulating film 15, and the high dielectric constant insulating film 7 on the same layer as the gate insulating film 8, so as to reach a pair of the n-type semiconductor regions 12. Wires 19 are connected to a pair of the n-type semiconductor regions 12 through plugs (conductive pieces) 18 buried in the contact holes 17a. For the shape of the hole used to bury the plug 18, a circular contact hole is preferred, because of the necessity of reducing the parasitic capacitance. However, a slot shape may be adopted, which is formed so as to bridge the n-type semiconductor regions 12 forming the source and the drain and the device isolation sections. In this case, conductive films to be buried in this slot can also be used as local wirings.

Next, an n-channel MIS transistor $Q_2$ that is formed in the logic region will be described with reference to FIG. 5. The threshold voltage (Vth) of the n-channel MIS transistor $Q_2$ is comparably low, which can be regarded as, for example, about 0.1 Volt. In case of using two kinds of supply voltages, for example, the operation voltage (Vcc) applied to the n-channel MIS transistor $Q_2$ is a low voltage, which can be set to, for example, about 0.85 Volt.

The n-channel MIS transistor $Q_2$ is formed, in the same manner as the n-channel MIS transistor $Q_1$, in the active region surrounded by the device isolation sections formed on the p-type semiconductor substrate 1. On the surface of the semiconductor substrate 1, a pair of the n-type semiconductor regions 12 forms the source and the drain. Further, the gate insulating film 8, that is formed of the high dielectric constant insulating film 7, is formed on the semiconductor substrate 1, on which the gate electrode 11 formed of the polycrystalline silicon film 10 is formed. The spacer 13 and the silicide layer 14 are formed on the sidewall and on the upper surface of the gate electrode 11, respectively.

However, the high dielectric constant insulating film 7 is formed only in a region surrounded by the gate electrode 11, the spacer 13, and the semiconductor substrate 1, which makes up the gate insulating film 8. The silicide layers 14 for lowering the resistance are formed on a pair of the n-type semiconductor regions 12.

To cover substantially the whole surface of the semiconductor substrate 1, the SAC insulating film 15 and the interlayer insulating film 16 are formed in order from the lower layer. Contact holes 17 are formed through the interlayer insulating film 16 and the insulating film 15 so as to reach the silicide layers 14 on a pair of the n-type semiconductor regions 12. Wires 19 are connected to the silicide layers 14 on a pair of the n-type semiconductor regions 12 through the plugs 18 buried in the contact holes 17.

Next, an n-channel MIS transistor 03, that is formed in the I/O region, will be described with reference to FIG. 6. The threshold voltage (Vth) of the n-channel MIS transistor $Q_3$ is comparably high, which can be regarded as, for example, about 0.4 Volt. In case of using two kinds of supply voltages, for example, the operation voltage (Vcc) applied to the n-channel MIS transistor $Q_3$ is a high voltage, which can be set to, for example, about 1.5 Volt.

The n-channel MIS transistor $Q_3$ is formed, in the same manner as the n-channel MIS transistor $Q_1$, in the active region surrounded by the device isolation sections that are formed on the p-type semiconductor substrate 1. On the surface of the semiconductor substrate 1, a pair of the n-type semiconductor regions 12 forms the source and the drain.

However, a gate insulating film 9, having a laminated structure made of a silicon oxide film 6 and the high dielectric constant insulating film 7, is formed on the semiconductor substrate 1. The gate electrode 11 of the polycrystalline silicon film formed on the gate insulating film 9. And, the laminated layer (the silicon oxide film 6 and the high dielectric constant insulating film 7) is formed only in a region surrounded by the gate electrode 11, the spacer 13, and the semiconductor substrate 1, which makes up the gate insulating film 9. The silicide layers 14 are formed on a pair of the n-type semiconductor regions 12.

To cover substantially the whole surface of the semiconductor substrate 1, the SAC insulating film 15 and the interlayer insulating film 16 are formed in order from the lower layer. The contact holes 17 are formed through the interlayer insulating film 16 and the insulating film 15 so as to reach the silicide layers 14 on a pair of the n-type semiconductor regions 12. The wires 19 are connected to the silicide layers 14 on a pair of the n-type semiconductor regions 12 through the plugs 18 buried in the contact holes 17.

Next an n-channel MIS transistor $Q_4$, forming the capacitance element will be described with reference to FIG. 7. In case of using two kinds of supply voltages, for example, the operation voltage (Vcc) applied to the n-channel MIS transistor $Q_4$ is a low voltage, which can be set to, for example, about 0.85 Volt.

The n-channel MIS transistor $Q_4$ has substantially the same structure as the n-channel MIS transistor $Q_1$. However, in the active region that forms the n-channel MIS transistor $Q_4$, an n-well 4a can be formed, in addition to a p-well of the same conductive type as the semiconductor substrate 1. And, the operation voltage (Vcc) is applied to the gate electrode 11, and a pair of the n-type semiconductor regions 12 is connected to the ground voltage.

TABLE 1

|  | I/O region | Logic region | Memory region | Capacitance element |
|---|---|---|---|---|
| Vcc | 1.5 V | 0.85 V | 0.85 V | 0.85 V |
| Vth | High (0.4 V) | Low (0.1 V) | High (0.4 V) | — |
| Gate insulating film | High-k/SiO | High-k | High-k | High-k |
| Silicide layer | Included | Included | Not included | Included |
| SAC insulating film | SiN (Optional) | SiN (Optional) | SiN or High-k | SiN (Optional) |
| Shape of contact hole | Circular | Circular | Circular or slot | Circular |

High-k: high dielectric constant insulating film
SiO: silicon oxide film
SiN: silicon nitride film Table 1 gives a brief summary of the construction of the MIS transistor in the memory region, the MIS transistor in the logic region, the MIS transistor in the I/O region, and the MIS transistor forming the capacitance element.

In the MIS transistor in the memory region, the MIS transistor in the logic region, and the MIS transistor forming the capacitance element, to which a low voltage is applied in correspondence with the two kinds of supply voltages, the gate insulating film is made of a high dielectric constant insulating film; whereas, in the MIS transistor in the I/O region, the gate insulating film is made of a laminated film composed of a silicon oxide film and a high dielectric constant insulating film.

The silicide layers are formed on the upper surfaces of a pair of the n-type semiconductor regions that form the sources and the drains of the MIS transistors in the logic region, MIS transistors in the I/O region, and MIS transistors forming the capacitance elements; however, the silicide layers are not formed on the upper surfaces of a pair of the n-type semiconductor regions that form the sources and the drains of the MIS transistors in the memory region.

When the circumstances need the SAC technique that permits an alignment dislocation between the contact holes and the gate electrode, the SAC insulating film is formed beneath the interlayer insulating film, which has a high etching selection ratio relative to the interlayer insulating film and functions as an etching stopper layer. For example, the interlayer insulating film is formed of a silicon oxide film, and the SAC insulating film is formed of a silicon nitride film. When the circumstances do not need the SAC technique (described in the embodiment 2), the SAC insulating film is not formed; however, the high dielectric constant insulating film of the same layer as the gate insulating film can serve as an etching stopper layer.

For the shape of the hole in which the plug is buried, a circular contact hole is preferred, because of the necessity of reducing the parasitic capacitance in any MIS transistors. However, the hole in the memory region may have a slot form as well.

Next, one example of the method of manufacturing a semiconductor integrated circuit device according to the embodiment 1 will be explained in the processing order with reference to the sectional views of a major part of the semiconductor substrate, as illustrated in FIG. 8 through FIG. 19. It is assumed that the semiconductor circuit device is supplied with two kinds of supply voltages, the memory region and the logic region are given a low voltage, and the I/O region is given a high voltage.

Figure 8:
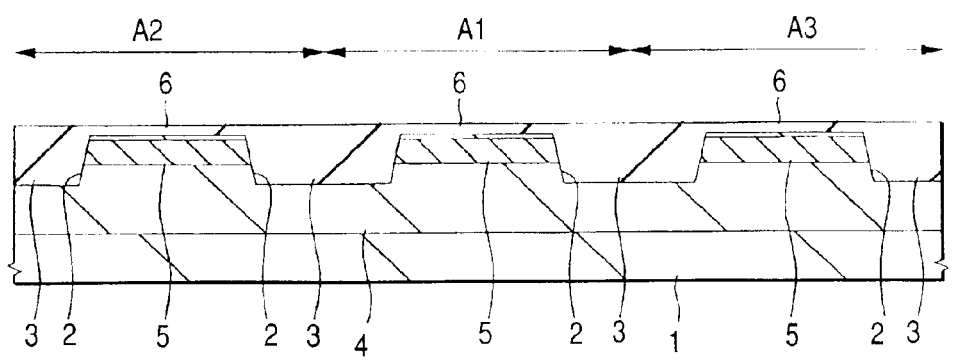
FIG. 8 is a sectional view of a major part of the semiconductor substrate, which illustrates a step in a method of manufacturing the semiconductor integrated circuit device according to one embodiment of the invention.

As shown in FIG. 8, first a semiconductor substrate 1 made of a p-type silicon monocrystal with a specific resistance of about 10 Ωcm is prepared, and the shallow trenches 2 are formed on the principal plane of the semiconductor substrate 1.

Thereafter, a thermal oxidation processing is applied to the semiconductor substrate 1, and the silicon oxide film 3 is deposited to overlie the semiconductor substrate 1.

Then, the deposited layer is polished using a CMP (chemical mechanical polishing) method so as to leave the silicon oxide film 3 inside the shallow trenches 2, thereby is forming the device isolation sections. Next, a heat treatment is applied to the semiconductor substrate 1 at a temperature of about 1000° C. to thereby fasten the silicon oxide film 3 embedded in the device isolation sections.

Next, boron ions are implanted into the semiconductor substrate 1, as p-type impurities, to form the p-type well 4. Subsequently, ions of impurities are implanted to form a punch-through stopper layer 5, thereby restraining the short channel effect. Then, after the surface of the semiconductor substrate 1 is washed with an aqueous solution of the hydrofluoric acid system, the silicon oxide film 6, having a thickness of about 1.5 nm, is formed on the surface of the semiconductor substrate 1. The silicon oxide film 6 can be formed by a thermal oxidation method or a thermal CVD (chemical vapor deposition) method.

Figure 9:
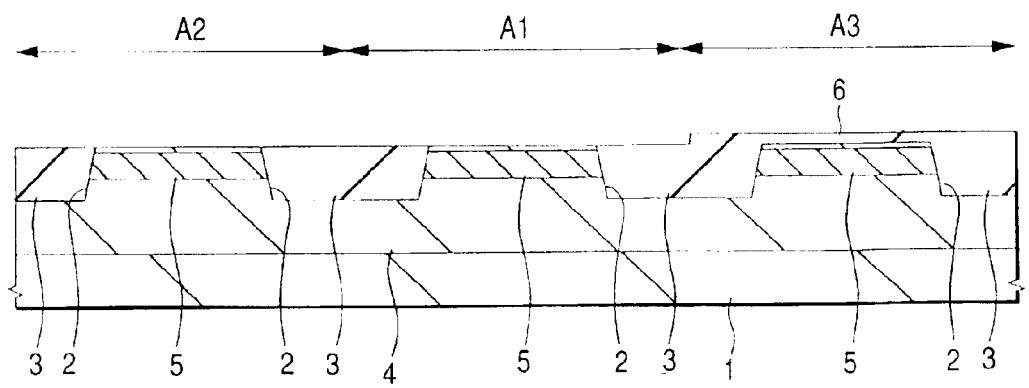
FIG. 9 is a sectional view of a major part of the semiconductor substrate, which illustrates a step in the method of manufacturing the semiconductor integrated circuit device according to the one embodiment of the invention.

Next, as shown in FIG. 9, the silicon oxide film 6 is removed from the memory region A1 and logic region A2 using a patterned resist film as a mask, thereby leaving the silicon oxide film 6 on the I/O region A3.

Figure 10:
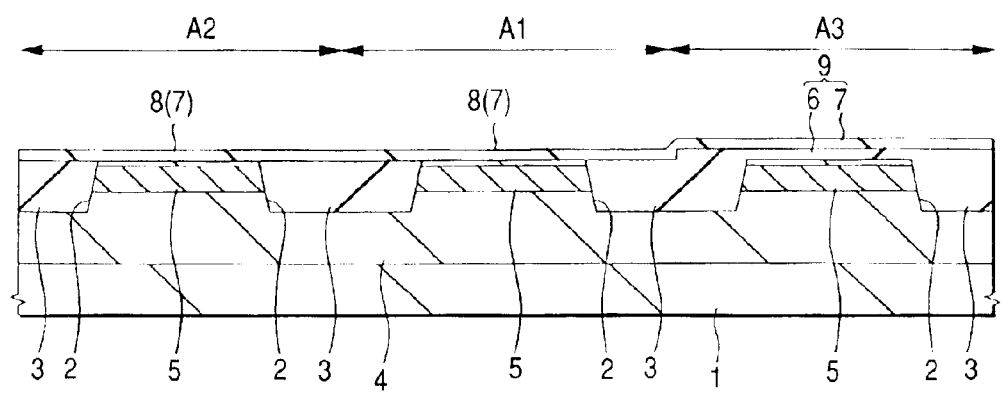
FIG. 10 is a sectional view of a major part of the semiconductor substrate, which illustrates a step in the method of manufacturing the semiconductor integrated circuit device according to the one embodiment of the invention.

Next, as shown in FIG. 10, the high dielectric constant insulating film 7, for example, an alumina film or a titanium oxide film, is formed to overlie the semiconductor substrate 1. The high dielectric constant insulating film 7 can be deposited by means of the sputtering method. The thickness of the high dielectric constant insulating film 7, which is formed to overlie the semiconductor substrate 1, is set so that the effective thickness thereof becomes about 1 nm. In case of an alumina film or a titanium oxide film, the film is deposited to about 2 nm thick in consideration of the relative dielectric constant. Thereby, a gate insulating film 8, that is made of the high dielectric constant insulating film 7 having an effective film thickness of about 1 nm, is formed in the memory region A1 and logic region A2, to which a low voltage is applied; and, the gate insulating film 9, that is composed of a laminated film of the silicon oxide film 6 and the high dielectric constant insulating film 7 having the effective film thickness of about 2.5 nm, is formed in the I/O region A3, to which a high voltage is applied.

Figure 11:
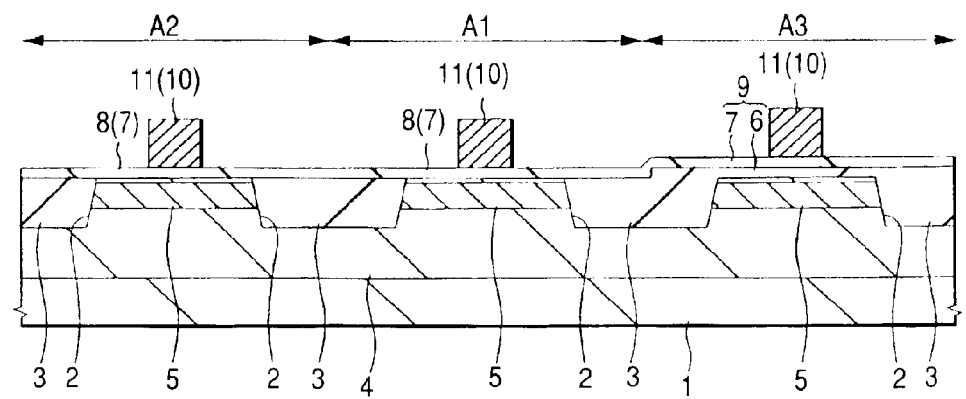
FIG. 11 is a sectional view of a major part of the semiconductor substrate, which illustrates a step in the method of manufacturing the semiconductor integrated circuit device according to the one embodiment of the invention.

Next, as shown in FIG. 11, the polycrystalline silicon film 10, with impurities added, is deposited by the CVD method, to overlie the semiconductor substrate 1. The thickness of the polycrystalline silicon film 10 is about 140 nm, and the sheet resistance thereof is about 100 Ω/□. Next, the polycrystalline silicon film 10 is etched using a patterned resist film as a mask to form the gate electrodes 11 of the MIS transistors in the memory region A1, logic region A2, and I/O region A3. Thereafter, dry oxidation processing of about 800° C. is applied to the semiconductor substrate 1.

Figure 12:
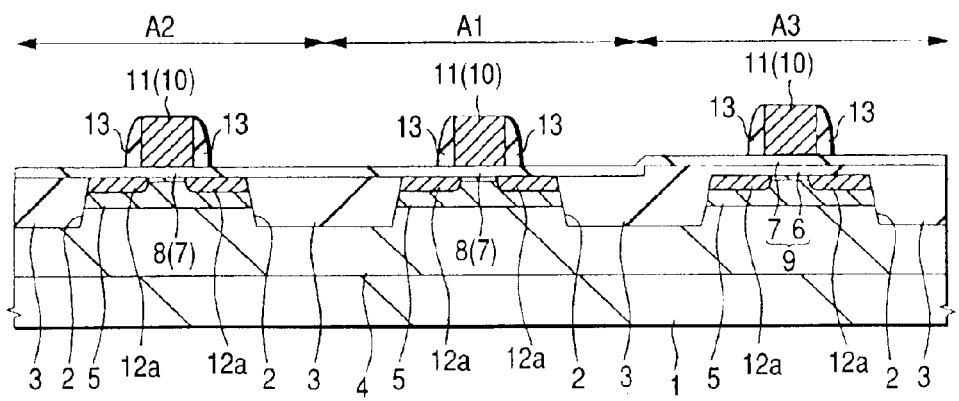
FIG. 12 is a sectional view of a major part of the semiconductor substrate, which illustrates a step in the method of manufacturing the semiconductor integrated circuit device according to the one embodiment of the invention.

Next, as shown in FIG. 12, the ion implantation of n-type impurity, for example, arsenic, is applied to the p-well 4, using the gate electrodes 11 as a mask, thereby forming diffusion regions 12a that constitute parts of the sources and the drains of the MIS transistors in the memory region A1, logic region A2, and 110 region A3. The arsenic ions are implanted under the energy 3 keV and the dose $1\times10^{15}$ cm$^{-2}$. Although not illustrated here, the ion implantation of p-type impurity, for example, boron, may be applied to the p-well 4, using the gate electrodes 11 as a mask, thereby forming pocket regions underneath the diffusion regions 12a, which effect to restrain expansions of the depletion layers in the source and drain regions, to thereby suppress punch through.

Next, the silicon oxide film is deposited by the CVD method so as to overlie the semiconductor substrate 1, and then the silicon oxide film is etched back by plasma etching, thereby forming the spacers 13 on the sidewalls of the gate electrodes 11 of the MIS transistors in the memory region A1, logic region A2, and I/O region A3. In the plasma etching, the high dielectric constant insulating film 7 functions as an etching stopper layer, which prevents damage to the semiconductor substrate 1.

Figure 13:
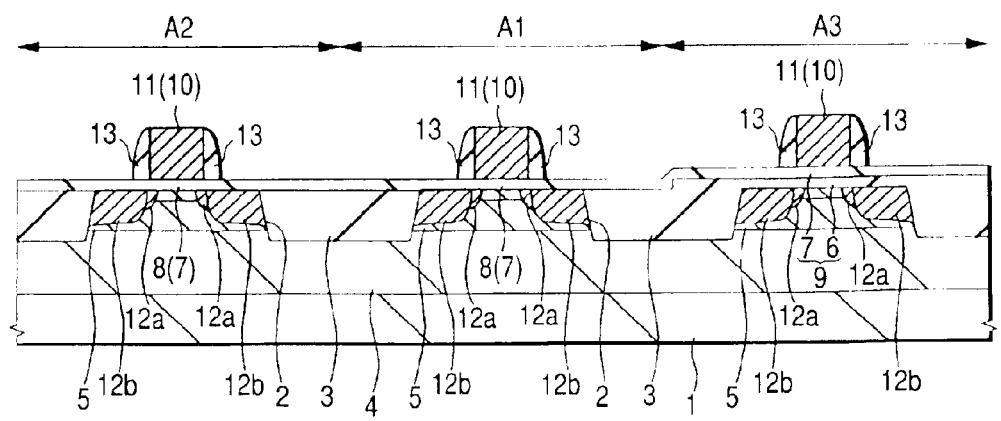
FIG. 13 is a sectional view of a major part of the semiconductor substrate, which illustrates a step in the method of manufacturing the semiconductor integrated circuit device according to the one embodiment of the invention.

Next, as shown in FIG. 13, the ion implantation of an n-type impurity, for example, arsenic, is applied to the p-well 4, using the gate electrodes 11 and the spacers 13 as a mask, thereby forming diffusion regions 12b that constitute the other parts of the sources and the drains of the MIS transistors in the memory region A1, logic region A2, and I/O region A3. The arsenic ions are implanted under the energy 45 keV and the dose $2\times10^{15}$ cm$^{-2}$.

Figure 14:
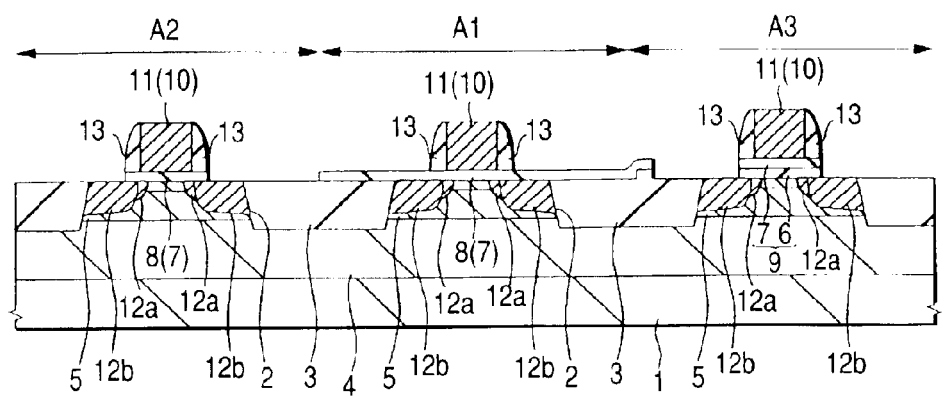
FIG. 14 is a sectional view of a major part of the semiconductor substrate, which illustrates a step in the method of manufacturing the semiconductor integrated circuit device according to the one embodiment of the invention.

Next, as shown in FIG. 14, after covering the memory region A1 with a resist film, the high dielectric constant insulating film 7 in the logic region A2, that is exposed over the semiconductor substrate 1, and the laminated film composed of the silicon oxide film 6 and the high dielectric constant insulating film 7 in the I/O region A3 are removed by sputter etching. Thereby, the surfaces of the diffusion regions 12b in the logic region A2 and I/O region A3 are exposed. The sputter etching is not applied to the high dielectric constant insulating film 7 in the memory region A1 so as to leave it over the semiconductor substrate 1, thereby preventing damage to the semiconductor substrate 1 in the memory region A1.

And, after removing the resist film, a high melting point metal film, for example, a cobalt film of about 10 to 20 nm thick, is deposited by the sputtering method so as to overlie the semiconductor substrate 1.

Figure 15:
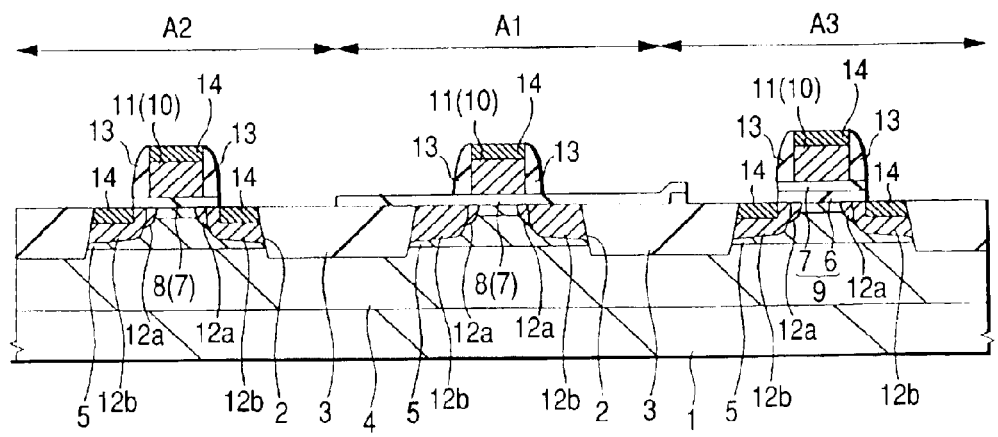
FIG. 15 is a sectional view of a major part of the semiconductor substrate, which illustrates a step in the method of manufacturing the semiconductor integrated circuit device according to the one embodiment of the invention.

Next, as shown in FIG. 15, the heat treatment of 500 to 600° C. Is applied to the semiconductor substrate 1 to form the silicide layers 14 selectively on the surfaces of the gate electrodes 11 of the MIS transistors in the memory region A1, on the surfaces of the gate electrodes 11 and the diffusion regions 12b of the MIS transistors in the logic region A2, and on the surfaces of the gate electrodes 11 and the diffusion regions 12b of the MIS transistors in the I/O region A3. After this processing, the un-reacted cobalt film is removed by wet etching; and, subsequently, heat treatment of 700 to 800° C. is applied to the semiconductor substrate 1 to reduce the resistance of the silicide layers 14. The thickness of the silicide layers 14 after the heat treatment is about 30 nm, and the sheet resistance thereof is about 4 Ω/□. To form the silicide layers 14 on the surfaces of the diffusion regions 12b in the logic region A2 and I/O region A3 lowers the resistance of the diffusion regions 12b, which serves to increase the operation speed of the logic circuit, especially in the logic region A2. On the other hand, by not forming the silicide layers on the surfaces of the diffusion regions 12b in the memory region A1, damage to the semiconductor substrate 1 in the memory region A1 is prevented.

Figure 16:
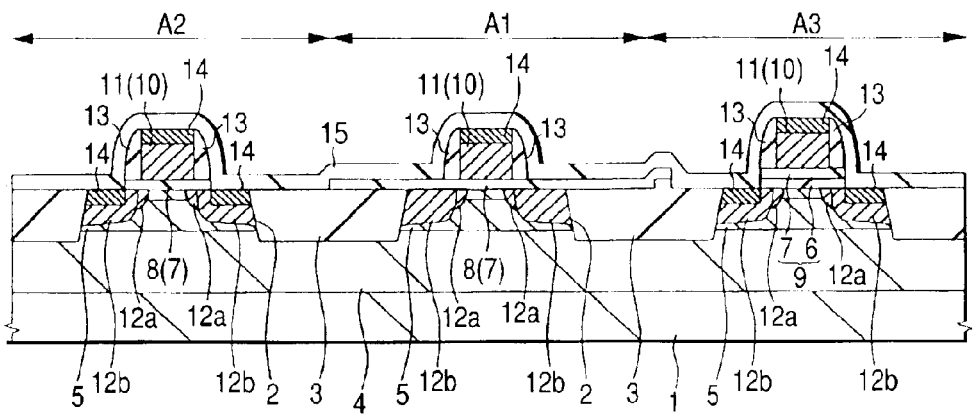
FIG. 16 is a sectional view of a major part of the semiconductor substrate, which illustrates a step in the method of manufacturing the semiconductor integrated circuit device according to the one embodiment of the invention.

Next, as shown in FIG. 16, the SAC insulating film 15, for example, a silicon nitride film, is deposited by the plasma CVD method so as to overlie the semiconductor substrate 1. When the alignment margin of the device isolation sections and the contact holes formed at the subsequent process are insufficient, the SAC technique that permits an alignment dislocation is used.

Figure 17:
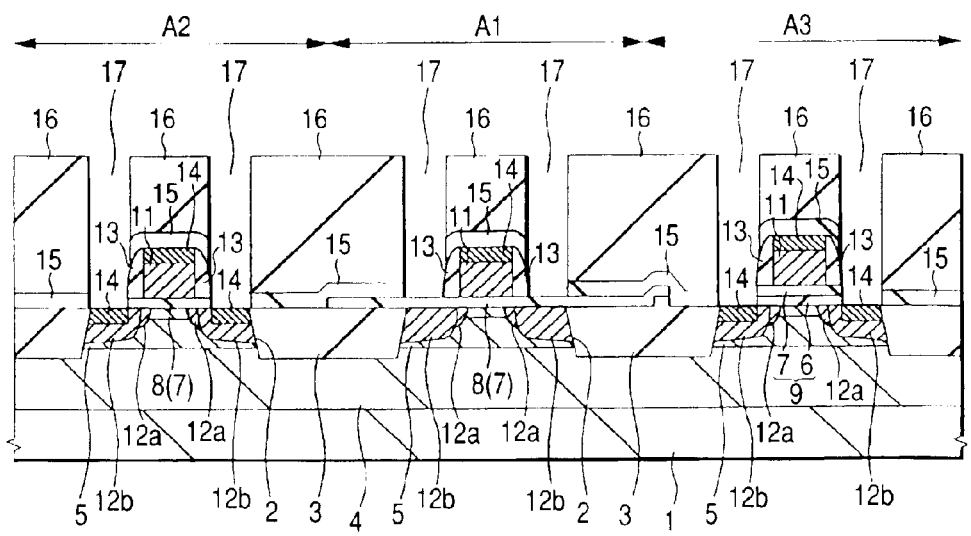
FIG. 17 is a sectional view of a major part of the semiconductor substrate, which illustrates a step in the method of manufacturing the semiconductor integrated circuit device according to the one embodiment of the invention.

Next, as shown in FIG. 17, the interlayer insulating film 16, for example, a silicon oxide film, is formed to overlie the semiconductor substrate 1. Subsequently, the interlayer insulating film 16 is etched by using a patterned resist film as a mask and by using the insulating film 15 as an etching stopper layer. This etching adopts an etching condition under which the etching speed of the interlayer insulating film 16 becomes higher than the etching speed of the insulating film 15. Next, the insulating film 15 is etched. This etching adopts the etching condition under which the etching speed of the insulating film 15 becomes higher than the etching speed of the high dielectric constant insulating film 7, and it makes the high dielectric constant insulating film 7 function as an etching stopper layer in the memory region A1.

Thus, the contact holes 17 are formed in the logic region A2 and I/O region A3, so as to reach the silicide layers 14 formed on the surfaces of the diffusion regions 12b of the MIS transistors, and the contact holes 17 are formed to reach the high dielectric constant insulating film 7 in the memory region A1. The contact holes 17 can be made circular, with a diameter of about 0.14 μm.

Although not illustrated, the contact holes are simultaneously formed so as to reach the silicide layers 14 on the gate electrodes 11 of the MIS transistors in the memory region A1, logic region A2, and I/O region A3.

Figure 18:
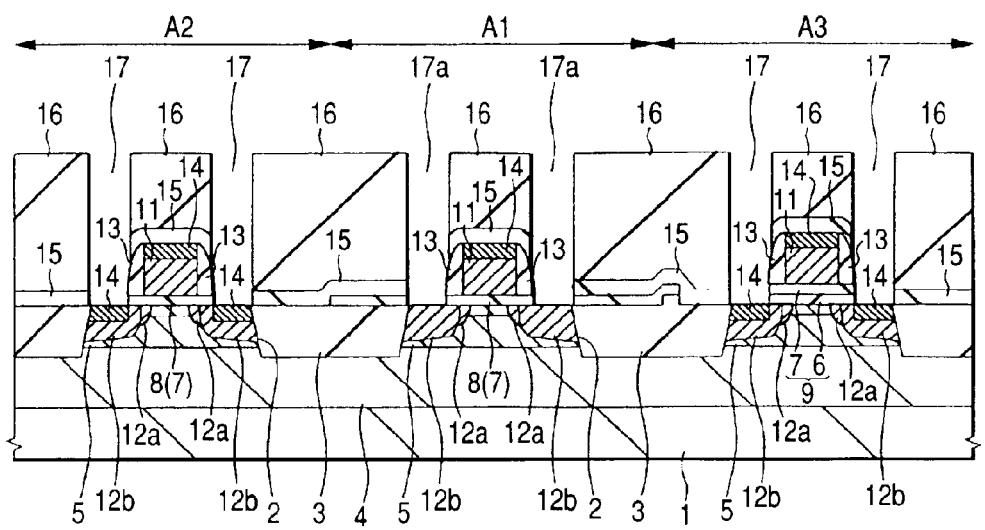
FIG. 18 is a sectional view of a major part of the semiconductor substrate, which illustrates a step in the method of manufacturing the semiconductor integrated circuit device according to the one embodiment of the invention.

Next, as shown in FIG. 18, after covering the logic region A2 and the I/O region A3 with a resist film, the high dielectric constant insulating film 7 on the bottoms of the contact holes 17 in the memory region A1 is removed by sputter etching, thereby forming the contact holes 17a that reach the diffusion regions 12b of the MIS transistors.

Now, the contact holes 17 in the logic region A2 and I/O region A3 and the contact holes 17a in the memory region A1 may be formed in different processes. The following process may be adopted as an example. The interlayer insulating film 16 and the insulating film 15 in the logic region A2 and 110 region A3 are sequentially etched using a patterned resist film as a mask so as to form the contact holes 17; and then, the interlayer insulating film 16, the insulating film 15, and the high dielectric constant insulating film 7 in the memory region A1 are sequentially etched to form the contact holes 17a.

Figure 19:
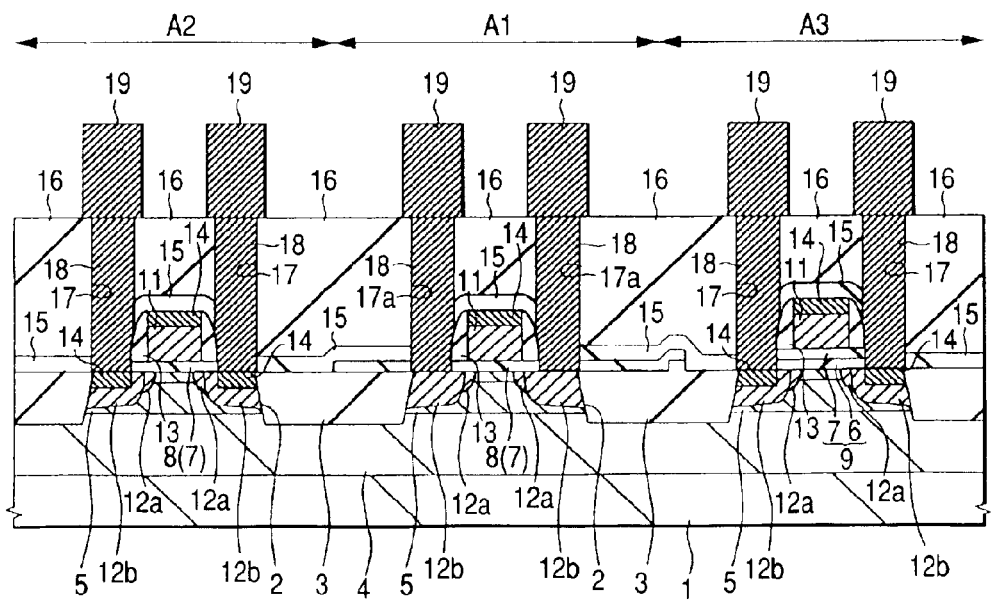
FIG. 19 is a sectional view of a major part of the semiconductor substrate, which illustrates a step in the method of manufacturing the semiconductor integrated circuit device according to the one embodiment of the invention.

Next, as shown in FIG. 19, after removing the above resist film, a titanium nitride film is deposited, for example, by the CVD method, so as to overlie the whole semiconductor substrate 1, including the insides of the contact holes 17, 17a. Further, a metal film to bury the contact holes 17, 17a, for example, a tungsten film, is formed. The tungsten film can be deposited by the CVD method or a sputtering method. Subsequently, the titanium nitride film and the metal film lying in the other areas than the contact holes 17, 17a are removed, for example, by the CMP method so as to form the plugs 18 inside the contact holes 17, 17a.

Subsequently, after forming a metal film, for example, a tungsten film, to overlie the semiconductor substrate 1, the metal film is processed through the etching, using a patterned resist film as a mask, thereby forming the wires 19. At this stage, the semiconductor integrated circuit device of the embodiment 1 is formed virtually completely. Further, the upper layer wires may be formed as needed.

Thus, according to the embodiment 1, the high dielectric constant insulating film 7 on the diffusion regions 12b of the MIS transistors in the logic region A2 and I/O region A3 is removed, and, on the surfaces thereof, the silicide layers 14 are formed to thereby lower the resistances of diffusion regions 12b and increase the operation speed. On the other hand, the silicide layers 14 are not formed on the diffusion regions 12b of the MIS transistors in the memory region A1, and the diffusion regions 12b are covered with the high dielectric constant insulating film 7, which makes it possible to prevent damage to the semiconductor substrate 1 during forming of the spacers 13, silicide layers 14, and contact holes 17, and to reduce the junction leakage currents flowing across the memory cells.

Embodiment 2

Another example of an semiconductor integrated circuit device representing an embodiment 2 will be described with reference to the sectional views of the major part of the semiconductor substrate, illustrated in FIG. 20 and FIG. 21.

Figure 20:
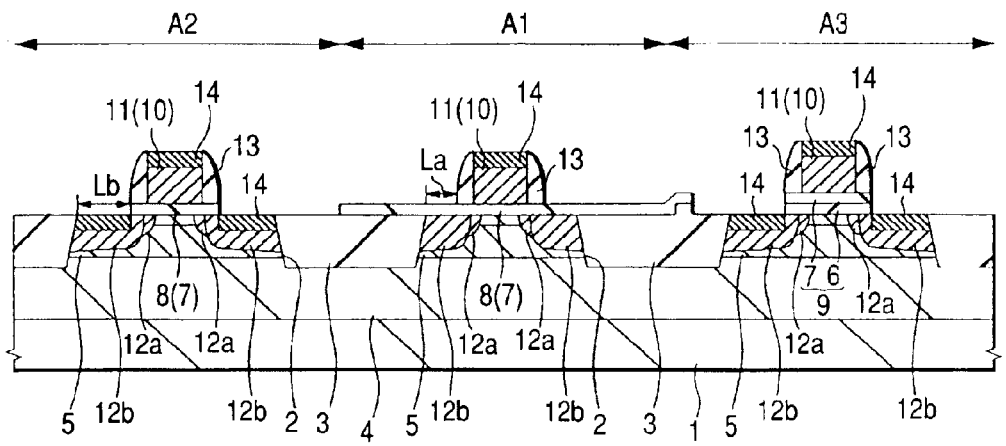
FIG. 20 is a sectional view of a major part of the semiconductor substrate, which illustrates a step in the method of manufacturing a semiconductor integrated circuit device according to a second embodiment of the invention.

FIG. 20 illustrates the n-channel MIS transistors in the memory region A1, logic region A2, and I/O region A3, which has completed forming of the silicide layers 14 through the self-aligning process. In the semiconductor integrated circuit device of the embodiment 2, the gate insulating films 8, 9, gate electrodes 11, n-type semiconductor regions (diffusion regions) 12a, 12b, spacers 13, and silicide layers 14 are formed in the same manner as the manufacturing method already described for embodiment 1 with reference to FIG. 1 through FIG. 15.

However, it is possible to set the distances Lb from the spacers 13 to the device isolation sections of the MIS transistors in the logic region A2 and I/O region A3 so that they are larger than the distances La from the spacers 13 to the device isolation sections of the MIS transistors in the memory region A1, to provide a requested higher integration, and to set the alignment margin between the contact holes 17 and the device isolation sections in the logic region A2 and I/O region A3 to a comparably larger value.

Therefore, the diffusion regions 12b of the MIS transistors in the memory region A1, logic region A2, and I/O region A3 are formed through self-aligning relative to the spacers 13; accordingly, the widths of the diffusion regions 12b of the MIS transistors in the logic region A2 and I/O region A3 become larger than the widths of the diffusion regions 12b of the MIS transistors in the memory region A1. Since the widths of the spacers 13 are the same in the MIS transistors in the memory region A1, logic region A2, and I/O region A3, the distances from the gate electrodes 11 to the device isolation sections of the MIS transistors in the logic region A2 and I/O region A3 become larger than the distances from the gate electrodes 11 to the device isolation sections of the MIS transistors in the memory region A1.

Figure 21:
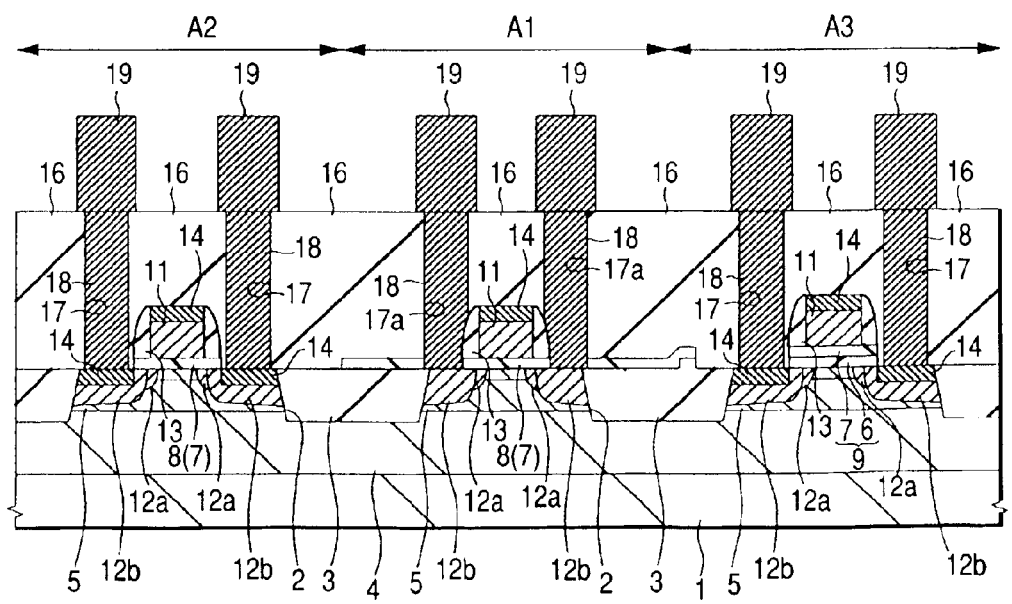
FIG. 21 is a sectional view of a major part of the semiconductor substrate, which illustrates a step in the method of manufacturing the semiconductor integrated circuit device according to the second embodiment of the invention.

FIG. 21 illustrates the MIS transistors in the memory region A1, logic region A2, and I/O region A3, in which the forming of the wires 19 has been completed through the subsequent process. As illustrated in the drawing, without using the SAC technique, namely, without forming the insulating film that functions as an etching stopper layer (the insulating film 15 in the embodiment 1) for the interlayer insulating film 16 in the logic region A2 and 110 region A3, the contact holes 17 are formed in the interlayer insulating film 16. In the memory region A1, on the other hand, the contact holes 17 are formed by using the high dielectric constant insulating film 7, that is formed on the same layer as the gate insulating film 8, as an etching stopper layer for the interlayer insulating film 16. Thereafter, the contact holes 17a that reach the diffusion regions 12b of the MIS transistors are formed by removing the high dielectric constant insulating film 7 lying on the bottoms of the contact holes 17 by sputter etching.

Thus, according to the embodiment 2, in case the alignment margin between the contact holes 17 and the device isolation sections can be taken to be comparably larger in the logic region A2 and I/O region A3, the SAC insulating film 15 may not be formed over the semiconductor substrate 1. In the memory region A1, on the other hand, since the high dielectric constant insulating film 7 on the same layer as the gate insulating film 8 functions as an etching stopper layer for the interlayer insulating film 16, even if parts of the contact holes 17 are formed on the silicon oxide film 3 forming the device isolation sections because the alignment margin in the memory region A1 is comparably small, the silicon oxide film 3 can be prevented from being shaved.

Embodiment 3

Another example of a semiconductor integrated circuit device representing an embodiment 3 will be described by reference to the sectional view of the major part of the semiconductor substrate, illustrated in FIG. 22.

Figure 22:
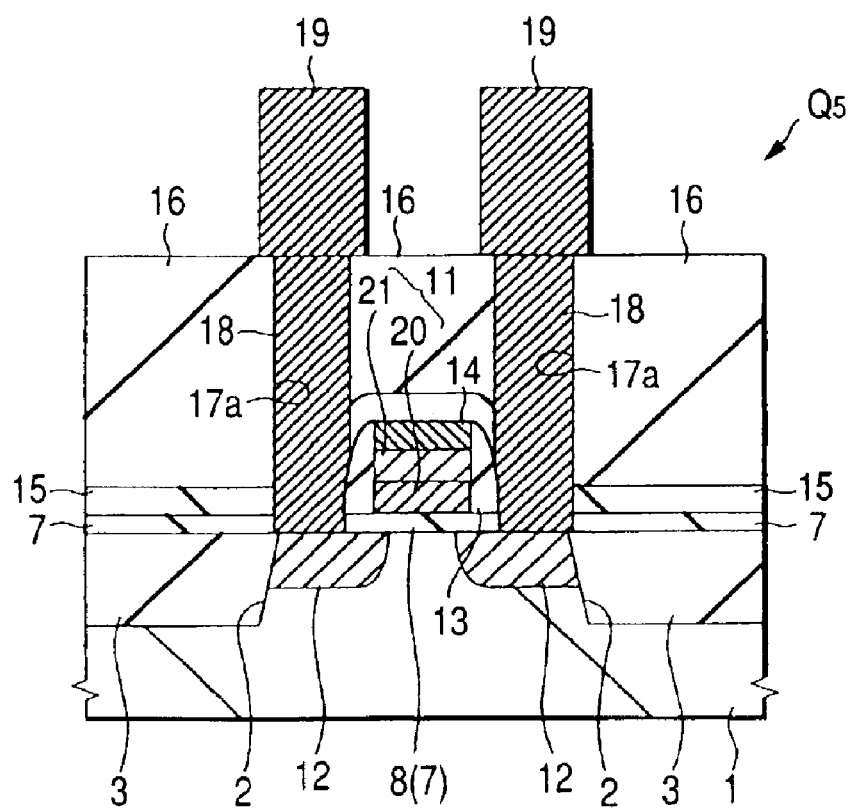
FIG. 22 is a sectional view of a major part of the semiconductor substrate, illustrating an n-channel MIS transistor formed in a memory region, according to a third embodiment of the invention.

FIG. 22 illustrates the n-channel MIS transistor in the memory region A1 of the semiconductor integrated circuit device.

An n-channel MIS transistor $Q_5$ is formed, in the same manner as the n-channel MIS transistor $Q_1$ illustrated in FIG. 4 in the embodiment 1, in an active region surrounded by device isolation sections. A pair of n-type semiconductor regions 12 forms the source and drain of the n-channel MIS transistor $Q_5$, and the high dielectric constant insulating film 7 forms the gate insulating film 8. The contact holes 17a are formed through the high dielectric constant insulating film 7 on the same layer as the gate insulating film 8 formed to cover substantially the whole surface of the semiconductor substrate 1, the insulating film 15, and the interlayer insulating film 16. The wires 19 are connected to a pair of the n-type semiconductor regions 12 through the plugs 18 embedded in the contact holes 17a.

The gate electrode 11 is formed in a laminated structure in which a silicon germanium layer 20 and a polycrystalline silicon film 21 are deposited sequentially from the lower layer.

The solid solubility of silicon germanium conductive impurities, for example, boron of the p-type impurities, is higher than that of silicon; therefore, by increasing the carrier density in the silicon germanium layer 20, it will be possible to prevent depletion of the carriers in the gate electrode 11 and to reduce the contact resistances. And, by forming the polycrystalline silicon film 21 on the upper layer of the silicon germanium layer 20, it will be possible to prompt the silicification reaction and to form the silicide layer 14 on the gate electrode 11.

The embodiment 3 is directed to a case in which the invention is applied to a MIS transistor in the memory region A1; however, it is also possible to apply the invention to the MIS transistors in the logic region A2 and I/O region A3, and to form the gate electrode 11 in a structure in which the silicon germanium layer 20 and polycrystalline silicon film 21 are laminated sequentially from the lower layer.

As described above, the invention has been described specifically with reference to embodiments. However, the invention is not limited to the above-described embodiments, and it should be well understood that various changes and variations are possible without a departure from the spirit and scope of the invention.

For example, the invention is applied to n-channel MIS transistors in the above-described embodiments; however, it can be applied as well to p-channel MIS transistors.

The typical effects obtained by the invention disclosed in this application will be described briefly.

In a circuit region to which a high-speed performance is desired, for example, the logic region and I/O region, it is possible to achieve high-speed performance by removing the high dielectric constant insulating film on the semiconductor region forming the sources and drains of the MIS transistors, and by forming the silicide layers of a low resistance on the surface of the semiconductor region. On the other hand, in a circuit region to which a high reliability is desired, for example, the memory region, it is possible to prevent damage to the semiconductor substrate in the processes of forming the spacers, silicide layers, and contact holes, and to attain a high reliability, by not forming the silicide layers on the semiconductor region forming the sources and drains of the MIS transistors, and covering the semiconductor region with the high dielectric constant insulating film.

What is claimed is:

1. A method of manufacturing a semiconductor integrated circuit device, comprising the steps of:
   (a) forming plural trenches on a surface of a semiconductor substrate of a first conductive type, and forming a first insulating film inside the plural trenches;
   (b) forming a second insulating film having a relative dielectric constant which is higher than that of the first insulating film on the surface of the semiconductor substrate;
   (c) forming a first conductive piece on the second insulating film; and
   (d) introducing first impurities of a second conductive type, opposite to the first conductive type, into the surface of the semiconductor substrate, in a state such that the second insulating film is left in a region at both ends of the first conductive piece.

2. A method of manufacturing a semiconductor integrated circuit device according to claim 1, further comprising the steps of:
   (e) forming a third insulating film to overlie the semiconductor substrate; and (f) applying anisotropic etching to the third insulating film so as to form a sidewall insulating film on sidewalls of the first conductive piece;

wherein, after applying the anisotropic etching, the surface of the semiconductor substrate is covered with the second insulating film.

3. A method of manufacturing a semiconductor integrated circuit device according to claim 2, wherein the third insulating film is made of an oxide film.

4. A method of manufacturing a semiconductor integrated circuit device according to claim 2, further comprising the step of:

(g) introducing second impurities of the second conductive type, in a state such that the second insulating film is left in a region between the sidewall insulating film on the surface of the semiconductor substrate and the first insulating film.

5. A method of manufacturing a semiconductor integrated circuit device according to claim 4, further comprising the steps of:

(h) removing the second insulating film from the region between the sidewall insulating film on the surface of the semiconductor substrate and the first insulating film; and (i) depositing a high melting point metal film to overlie the semiconductor substrate, and selectively forming a silicide layer in the region between the sidewall insulating film on the surface of the semiconductor substrate and the first insulating film.

6. A method of manufacturing a semiconductor integrated circuit device according to claim 1, wherein the first conductive piece has a silicon germanium film and a silicon film laminated sequentially from the lower layer.

7. A method of manufacturing a semiconductor integrated circuit device, comprising the steps of:

(a) preparing a semiconductor substrate of a first conductive type, having a first region and a second region on a surface thereof;

(b) forming plural trenches on the surface of the semiconductor substrate in the first region and the second region, and forming a first insulating film inside the plural trenches;

(c) forming a second insulating film having a relative dielectric constant which is higher than that of the first insulating film on the surface of the semiconductor substrate in the first region and the second region;

(d) forming a first conductive piece on the second insulating film in the first region, and forming a second conductive piece on the second insulating film in the second region;

(e) introducing first impurities of a second conductive type, opposite to the first conductive type, into the surface of the semiconductor substrate, in regions at both ends of the first conductive piece and regions at both ends of the second conductive piece;

(f) removing the second insulating film, except at least a lower layer of the first conductive piece and the second region;

(g) depositing a high melting point metal film to overlie the semiconductor substrate; and (h) selectively forming a silicide layer in a region between the first conductive piece on the surface of the semiconductor substrate and the first insulating film, in the first region.

8. A method of manufacturing a semiconductor integrated circuit device according to claim 7, further comprising, between the steps (e) and (f), the steps of:

(i) forming a third insulating film to overlie the semiconductor substrate; and (j) applying anisotropic etching to the third insulating film so as to form a first sidewall insulating film on sidewalls of the first conductive piece, and a second sidewall insulating film on sidewalls of the second conductive piece.

9. A method of manufacturing a semiconductor integrated circuit device according to claim 8, further comprising, between the steps (i) and (j), the step of:

(k) introducing second impurities of the second conductive type, in a region between the first sidewall insulating film on the surface of the semiconductor substrate and the first insulating film, and a region between the second sidewall insulating film and the first insulating film.

10. A method of manufacturing a semiconductor integrated circuit device according to claim 7, further comprising, between the steps (b) and (c), the step of:

(l) forming a silicon oxide film on the surface of the semiconductor substrate in the first region;

wherein, in the first region, the second insulating film is formed to overlie the semiconductor substrate with intervention of the silicon oxide film, and in the second region, the second insulating film is formed on the surface of the semiconductor substrate without intervention of the silicon oxide film.

11. A method of manufacturing a semiconductor integrated circuit device according to claim 7, wherein the first and second conductive pieces have a silicon germanium film and a silicon film laminated sequentially from the lower layer.

12. A method of manufacturing a semiconductor integrated circuit device according to claim 7, further comprising the steps of:

(m) depositing a third insulating film in the first and second regions;

(n) applying etching to the third insulating film to form a first contact hole in a region between the first conductive piece and the first insulating film, in the first region;

(o) applying etching to the third insulating film to form a second contact hole in a region between the second conductive piece and the first insulating film, in the second region; and (p) forming a third conductive piece in the first contact hole, and a fourth conductive piece in the second contact hole.

13. A method of manufacturing a semiconductor integrated circuit device according to claim 12, wherein the distance between the first conductive piece and the first insulating film in the first region is larger than the distance between the second conductive piece and the first insulating film in the second region.

14. A method of manufacturing a semiconductor integrated circuit device according to claim 13, wherein a part of the second contact hole overlaps with the first insulating film in the second region.

15. A method of manufacturing a semiconductor integrated circuit device according to claim 13, wherein the first and third insulating films are made of a silicon oxide film.

16. A method of manufacturing a semiconductor integrated circuit device according to claim 12, wherein the third insulating film has a silicon nitride film and a silicon oxide film laminated sequentially from the lower layer.

17. A method of manufacturing a semiconductor integrated circuit device according to claim 12, wherein a plane form of the third conductive piece is smaller than the plane form of the fourth conductive piece.

18. A method of manufacturing a semiconductor integrated circuit device according to claim 12, further comprising, between the steps (b) and (c), the step of:

(l) forming a silicon oxide film on the surface of the semiconductor substrate in the first region;

wherein, in the first region, the second insulating film is formed to overlie the semiconductor substrate with intervention of the silicon oxide film, and in the second region, the second insulating film is formed on the surface of the semiconductor substrate without intervention of the silicon oxide film.

19. A method of manufacturing a semiconductor integrated circuit device, comprising the steps of:

(a) forming plural trenches on a surface of a semiconductor substrate of a first conductive type, and forming a first insulating film inside the plural trenches;

(b) forming a second insulating film having a relative dielectric constant which is higher than that of the first insulating film on the surface of the semiconductor substrate;

(c) forming a first conductive piece on the second insulating film;

(d) introducing first impurities of a second conductive type, opposite to the first conductive type, into the surface of the semiconductor substrate, in a state such that the second insulating film is left in regions at both ends of the first conductive piece, in order to form a first conductive region;

(e) forming a third insulating film to overlie the semiconductor substrate;

(f) applying etching to the third and second insulating films to form a contact hole on the first semiconductor region; and (g) forming a second conductive piece in the contact hole;

wherein the etching of the step (f) includes a first etching that etches the third insulating film on the condition that the etching speed of the third insulating film is higher than that of the second insulating film, and a second etching that etches the second insulating film on a different condition from the first etching.

20. A method of manufacturing a semiconductor integrated circuit device according to claim 19, wherein the first and third insulating films are made of a silicon oxide film.

* * * * *